(12) United States Patent
Kramer

(10) Patent No.: US 9,758,610 B2
(45) Date of Patent: Sep. 12, 2017

(54) ACID-LABILE HYPERBRANCHED COPOLYMER AND ASSOCIATED PHOTORESIST COMPOSITION AND METHOD OF FORMING AN ELECTRONIC DEVICE

(71) Applicant: DOW Global Technologies LLC, Midland, MI (US)

(72) Inventor: John W. Kramer, Midland, MI (US)

(73) Assignee: DOW GLOBAL TECHNOLOGIES LLC, Midland, MI (US)

( * ) Notice: Subject to any disclaimer, the term of this patent is extended or adjusted under 35 U.S.C. 154(b) by 0 days.

(21) Appl. No.: 14/974,329

(22) Filed: Dec. 18, 2015

(65) Prior Publication Data

US 2017/0174808 A1 Jun. 22, 2017

(51) Int. Cl.
| | | |
|---|---|---|
| G03F 7/004 | (2006.01) | |
| C08F 220/18 | (2006.01) | |
| C08F 224/00 | (2006.01) | |
| G03F 7/20 | (2006.01) | |
| G03F 7/32 | (2006.01) | |
| G03F 7/039 | (2006.01) | |
| C08F 222/10 | (2006.01) | |
| C08F 220/28 | (2006.01) | |

(52) U.S. Cl.
CPC .......... *C08F 224/00* (2013.01); *C08F 220/18* (2013.01); *C08F 220/28* (2013.01); *C08F 222/1006* (2013.01); *G03F 7/0046* (2013.01); *G03F 7/039* (2013.01); *G03F 7/0392* (2013.01); *G03F 7/0397* (2013.01); *G03F 7/2004* (2013.01); *G03F 7/322* (2013.01)

(58) Field of Classification Search
CPC ...... G03F 7/004; G03F 7/0397; G03F 7/0392; G03F 7/0046; C08F 220/18; C08F 220/28; C08F 222/1006
USPC .......... 430/270.1, 281.1, 322; 526/319, 323.2
See application file for complete search history.

(56) References Cited

U.S. PATENT DOCUMENTS

| | | |
|---|---|---|
| 2,760,863 A | 8/1956 | Plambeck, Jr. |
| 2,850,445 A | 9/1958 | Oster |
| 2,875,047 A | 2/1959 | Oster |
| 3,097,096 A | 7/1963 | Oster |
| 3,427,161 A | 2/1969 | Laridon et al. |
| 3,479,185 A | 11/1969 | Chambers, Jr. |
| 3,549,367 A | 12/1970 | Chang et al. |
| 4,343,885 A | 8/1982 | Reardon, Jr. |
| 4,442,197 A | 4/1984 | Crivello et al. |

(Continued)

FOREIGN PATENT DOCUMENTS

JP 2002296782 A * 10/2002

OTHER PUBLICATIONS

Machine translation of JP 2002-296782 (no date).*

(Continued)

*Primary Examiner* — Amanda C Walke
(74) *Attorney, Agent, or Firm* — Cantor Colburn LLP

(57) ABSTRACT

An acid-labile hyperbranched copolymer is formed by copolymerizing monomers that include a difunctional monomer and a mono(meth)acrylate ester. The difunctional monomer includes at least one formal group, acetal group, or ketal group that makes the copolymer acid-labile. The copolymer is useful as a component of a photoresist composition that provides low line width roughness, among other desirable photolithographic properties.

9 Claims, 2 Drawing Sheets

(56) References Cited

U.S. PATENT DOCUMENTS

| | | | |
|---|---|---|---|
| 4,603,101 A | 7/1986 | Crivello | |
| 4,624,912 A | 11/1986 | Zweifel et al. | |
| 4,916,045 A * | 4/1990 | Koch | C08C 19/36 |
| | | | 430/270.1 |
| 5,872,158 A * | 2/1999 | Kuczynski | C08F 22/105 |
| | | | 522/114 |
| 7,067,601 B2 * | 6/2006 | Woods | C08F 20/28 |
| | | | 526/315 |
| 7,208,260 B2 * | 4/2007 | Jung | C07C 69/54 |
| | | | 430/270.1 |
| 8,431,325 B2 | 4/2013 | Hashimoto et al. | |
| 8,980,526 B2 * | 3/2015 | Yoon | G03F 7/031 |
| | | | 430/270.1 |
| 9,170,490 B2 * | 10/2015 | Lin | G03F 7/033 |
| 2007/0190449 A1 * | 8/2007 | Momose | G03F 7/0397 |
| | | | 430/270.1 |
| 2009/0198065 A1 * | 8/2009 | Momose | C08F 220/28 |
| | | | 546/245 |
| 2009/0233223 A1 * | 9/2009 | Tachibana | G03F 7/0045 |
| | | | 430/270.1 |
| 2011/0269074 A1 * | 11/2011 | Aqad | G03F 7/0045 |
| | | | 430/311 |
| 2012/0058427 A1 * | 3/2012 | Enomoto | G03F 7/0045 |
| | | | 430/270.1 |

OTHER PUBLICATIONS

Chochos et al., "Hyperbranched Polymers for Photolithographic Applications—Towards Understanding the Relationship between Chemical Structure of Polymer Resin and Lithographic Performances." Advanced Materials (2009), vol. 21, 1121-1125.

Ridaoui et al, "Chemically Amplified Photoresists for 193-nm Photolithography: Effect of Molecular Structure and Photonic Parameters on Photopatterning." Journal of Polymer Science, Part A (2010), vol. 48, 1271-1277.

Sheehan et al., "RAFT Technology for the Production of Advanced Photoresist Polymers" Proc. of SPIE vol. 6923, 2008 (9 pages).

Sheehan, et al., "Designing materials for advanced microelectronic patterning applications using controlled polymerization RAFT technology" Proc. of SPIE vol. 7972, 2011 (12 pages).

Sohn et al., "Preparation of Acid-Cleavable Branched Polymers for Argon Fluoride Photoresists via Reversible Addition-Fragmentation Chain-Transfer Polymerization." Journal of Applied Polymer Science (2012), Vol. 125, 344-352.

Sohn et al.,"Preparation of Well-Defined Acid-Cleavable Branched Polymers Composed of Methacrylates and Acrylates." Journal of Industrial and Engineering Chemistry (2015), vol. 21, 1098-1104.

* cited by examiner

ACID-LABILE HYPERBRANCHED COPOLYMER AND ASSOCIATED PHOTORESIST COMPOSITION AND METHOD OF FORMING AN ELECTRONIC DEVICE

FIELD

The present invention relates to an acid-labile hyperbranched copolymer useful in photoresist compositions.

INTRODUCTION

Copolymers for extreme ultraviolet photoresists are typically prepared by the free radical copolymerization of carefully selected (meth)acrylate monomers. The resulting linear copolymers typically have molecular weights in the range of 6,000 to 10,000 grams/mole in order to balance factors such as resist glass transition temperature and modulus, solubility (both during formulation and in developer following exposure), acid diffusion, and line edge roughness. The number of demanding requirements creates necessary tradeoffs when polymer molecular weight is concerned. For example, in order to have the most robust resist with a high modulus needed to access sub-20 nanometer features, a polymer with higher molecular weight would be desired. However, lower molecular weight is favored for reduced line edge roughness and increased solubility in developer. Finally, for acid diffusion an ideal resist would have high molecular weight in unexposed regions and low molecular weight in exposed areas to promote increased acid diffusion throughout the exposed area while retarding diffusion through the unexposed areas.

In order to reconcile these contradicting resist molecular weight demands, a new platform of polymeric resists has been developed based on a hyperbranched polymer architecture. See, e.g., C. L. Chochos et al. "Hyperbranched Polymers for Photolithographic Applications—Towards Understanding the Relationship between Chemical Structure of Polymer Resin and Lithographic Performances." *Advanced Materials* 2009, 21, 1121-1125; H. Ridaoui, et al. "Chemically Amplified Photoresists for 193-nm Photolithography: Effect of Molecular Structure and Photonic Parameters on Photopatterning." *Journal of Polymer Science, Part A* 2010, 48, 1271-1277; H. -S. Sohn et al. "Preparation of Acid-Cleavable Branched Polymers for Argon Fluoride Photoresists via Reversible Addition-Fragmentation Chain-Transfer Polymerization." *Journal of Applied Polymer Science* 2012, 125, 344-352; H. -S. Sohn et al. "Preparation of Well-Defined Acid-Cleavable Branched Polymers Composed of Methacrylates and Acrylates." *Journal of Industrial and Engineering Chemistry* 2015, 21, 1098-1104. Hyperbranched polymers can be prepared using difunctional monomers to link several individual polymer chains together, thus creating higher molecular weight polymers. In some cases, the difunctional monomer contains an acid-labile tertiary ester group. See, e.g., H. -S. Sohn et al. "Preparation of Acid-Cleavable Branched Polymers for Argon Fluoride Photoresists via Reversible Addition-Fragmentation Chain-Transfer Polymerization." *Journal of Applied Polymer Science* 2012, 125, 344-352; H. -S. Sohn et al. "Preparation of Well-Defined Acid-Cleavable Branched Polymers Composed of Methacrylates and Acrylates." *Journal of Industrial and Engineering Chemistry* 2015, 21, 1098-1104. However, there remains a desire for hyperbranched copolymers that provide improved line width roughness (LWR) relative to linear copolymers.

SUMMARY

One embodiment is an acid-labile hyperbranched copolymer, comprising the product of copolymerizing monomers comprising an acid-labile difunctional monomer having the structure

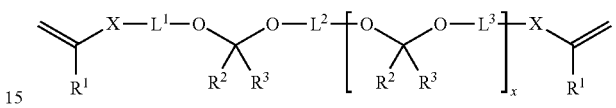

wherein each occurrence of $R^1$ is independently hydrogen, fluoro, methyl, trifluoromethyl, or cyano; each occurrence of $R^2$ and $R^3$ is independently hydrogen, unsubstituted or substituted $C_{1-18}$ linear or branched alkyl, unsubstituted or substituted $C_{3-18}$ cycloalkyl, unsubstituted or substituted $C_{6-18}$ aryl, or unsubstituted or substituted $C_{3-18}$ heteroaryl, or $R^2$ and $R^3$ are covalently linked to each other to form a ring that includes —$R^2$—C—$R^3$—; each occurrence of $L^1$, $L^2$, and $L^3$ is independently unsubstituted or substituted $C_{1-8}$-alkylene, unsubstituted or substituted —C(=O)—$C_{1-8}$-alkylene, unsubstituted or substituted —C(=O)—($C_{1-8}$-alkylene)-C(=O)—, unsubstituted or substituted —($C_{1-8}$-alkylene)-O—($C_{1-8}$-alkylene)-, unsubstituted or substituted —C(=O)—($C_{1-8}$-alkylene)-O—($C_{1-8}$-alkylene)-, or unsubstituted or substituted —C(=O)—($C_{1-8}$-alkylene)-O—($C_{1-8}$-alkylene)-C(=O)—; each occurrence of X is independently 1,2-phenylene, 1,3-phenylene, 1,4-phenylene, or —C(=O)—O— wherein the carbonyl carbon is bound to the adjacent carbon atom that is itself bound to $R^1$; and x is zero, 1, 2, or 3; and a mono(meth)acrylate ester comprising a base-solubility-enhancing mono(meth)acrylate ester, an acid-labile mono(meth)acrylate ester, a photoacid-generating mono(meth)acrylate ester, or a combination thereof to form a copolymer.

Another embodiment is a photoresist composition comprising the copolymer.

Another embodiment is a method of forming an electronic device, comprising: (a) applying a layer of the photoresist composition on a substrate; (b) pattern-wise exposing the photoresist composition to activating radiation; and (c) developing the exposed photoresist composition layer to provide a resist relief image.

These and other embodiments are described in detail below.

DETAILED DESCRIPTION

Figure 1:
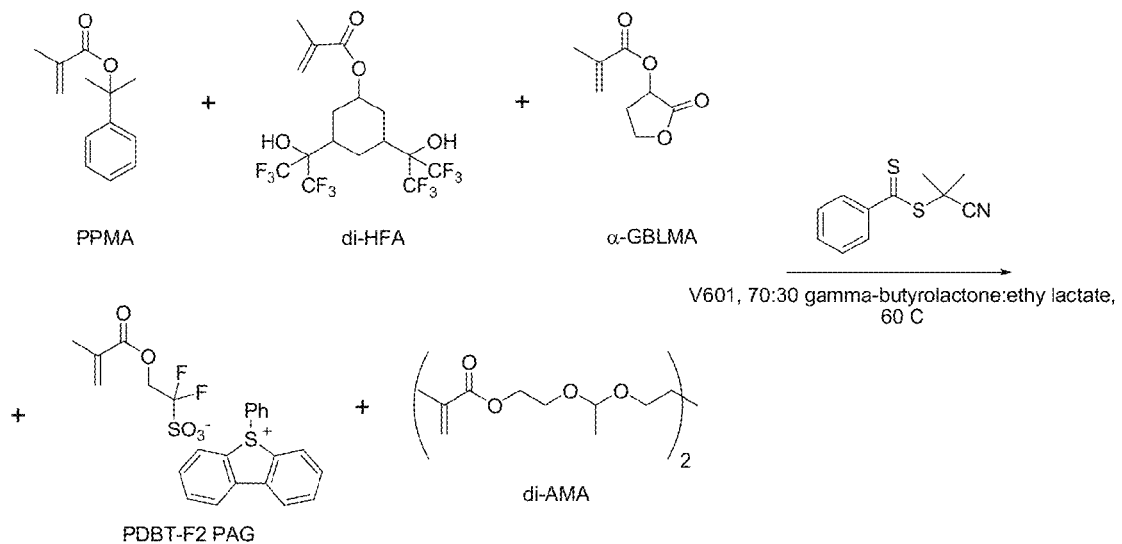
FIG. 1 is a synthetic scheme for the synthesis of an acid-labile hyperbranched copolymer.

An acid-labile hyperbranched copolymer is formed by copolymerizing monomers that include a difunctional monomer and a mono(meth)acrylate ester. The difunctional monomer includes at least one formal group, acetal group, or ketal group that makes the copolymer acid-labile. The copolymer is useful as a component of a photoresist composition that provides low line width roughness, among other desirable photolithographic properties.

The present inventor has determined that an acid-labile hyperbranched copolymer incorporating a formal-, acetal-, or ketal-substituted difunctional monomer exhibits increased acid-sensitivity relative to prior art hyperbranched copolymers. The increased acid-sensitivity is manifested as improved (reduced) line width roughness. Further advantages are obtained when a photoresist incorporating the hyperbranched copolymer is exposed with extreme ultraviolet (EUV) or electron beam exposure, and also when the hyperbranched copolymer incorporates a photoacid-generating monomer. Upon acid generation following exposure, exposed areas of the photoresist are degraded to low molecular weight fragments which improve acid mobility and developer solubility, while unexposed areas maintain the high molecular weight hyperbranched structure and impart high modulus to the remaining pattern.

One embodiment is an acid-labile hyperbranched copolymer, comprising the product of copolymerizing monomers comprising an acid-labile difunctional monomer having the structure

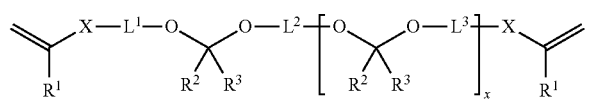

wherein each occurrence of $R^1$ is independently hydrogen, fluoro, methyl, trifluoromethyl, or cyano; each occurrence of $R^2$ and $R^3$ is independently hydrogen, unsubstituted or substituted $C_{1-18}$ linear or branched alkyl, unsubstituted or substituted $C_{3-18}$ cycloalkyl, unsubstituted or substituted $C_{6-18}$ aryl, or unsubstituted or substituted $C_{3-18}$ heteroaryl, or $R^2$ and $R^3$ are covalently linked to each other to form a ring that includes —$R^2$—C—$R^3$—; each occurrence of $L^1$, $L^2$, and $L^3$ is independently unsubstituted or substituted $C_{1-8}$-alkylene, unsubstituted or substituted —C(=O)—$C_{1-8}$-alkylene, unsubstituted or substituted —C(=O)—($C_{1-8}$alkylene)-C(=O)—, unsubstituted or substituted —($C_{1-8}$-alkylene)-O—($C_{1-8}$-alkylene)-, unsubstituted or substituted —C(=O)—($C_{1-8}$-alkylene)-O—($C_{1-8}$-alkylene)-, or unsubstituted or substituted —C(=O)—($C_{1-8}$-alkylene)-O—($C_{1-8}$-alkylene)-C(=O)—; each occurrence of X is independently 1,2-phenylene, 1,3-phenylene, 1,4-phenylene, or —C(=O)—O— wherein the carbonyl carbon is bound to the adjacent carbon atom that is itself bound to $R^1$; and x is zero, 1, 2, or 3; and a mono(meth)acrylate ester comprising a base-solubility-enhancing mono(meth)acrylate ester, an acid-labile mono(meth)acrylate ester, a photoacid-generating mono(meth)acrylate ester, or a combination thereof to form a copolymer.

As used herein, "(meth)acrylate" means acrylate (HC(=CH$_2$)C(=O)O—), fluoroacrylate (FC(=CH$_2$)C(=O)O—), cyanoacrylate ((N≡CC(=CH$_2$)C(=O)O—)), methacrylate (CH$_3$C(=CH$_2$)C(=O)O—), or trifluoromethacrylate (CF$_3$C(=CH$_2$)C(=O)O—).

As used herein, "substituted" means including at least one substituent such as a halogen (i.e., F, Cl, Br, I), hydroxyl, amino, thiol, carboxyl, carboxylate, amide, nitrile, sulfide, disulfide, nitro, $C_{1-18}$ alkyl, $C_{1-18}$ alkoxyl, $C_{6-18}$ aryl, $C_{6-18}$ aryloxyl, $C_{7-18}$ alkylaryl, or $C_{7-18}$ alkylaryloxyl. It will be understood that any group or structure disclosed with respect to the formulas herein may be so substituted unless otherwise specified, or where such substitution would significantly adversely affect the desired properties of the resulting structure. Also, "fluorinated" means having one or more fluorine atoms incorporated into the group. For example, where a $C_{1-18}$ fluoroalkyl group is indicated, the fluoroalkyl group can include one or more fluorine atoms, for example, a single fluorine atom, two fluorine atoms (e.g., as a 1,1-difluoroethyl group), three fluorine atoms (e.g., as a 2,2,2-trifluoroethyl group), or fluorine atoms at each free valence of carbon (e.g., as a perfluorinated group such as —CF$_3$, —C$_2$F$_5$, —C$_3$F$_7$, or —C$_4$F$_9$). It will be understood that carbon counts for substituted groups include any carbon atoms of substituents. For example, the $C_{1-8}$-alkylene group in "substituted —C(=O)—($C_{1-8}$-alkylene)-C(=O)—" has 1 to 8 carbon atoms, including any carbon atoms derived from substitution.

It will also be understood that when $L^1$, $L^2$, or $L^3$ is asymmetric, it can be oriented either way in the repeat unit. For example, when $L^1$ is unsubstituted —C(=O)—$C_{1-8}$-alkylene, the carbonyl end of the divalent $L^1$ group can be bound to the $R^1$—C(=CH$_2$)—C(=O)—O— group, or to the —O—C($R^2$)($R^3$)—O— group.

In some embodiments of the copolymer, each occurrence of $R^1$ is methyl. In some embodiments of the copolymer, each occurrence of $L^1$, $L^2$, and $L^3$ is independently $C_{2-4}$-alkylene, and each occurrence of X is —C(=O)—O— wherein the carbonyl carbon is bound to the adjacent carbon atom that is itself bound to $R^1$. In some embodiments of the copolymer, each occurrence of $R^2$ and $R^3$ is independently hydrogen, methyl, or ethyl; or $R^2$ and $R^3$ are covalently linked to each other to form tetramethylene (—(CH$_2$)$_4$—)or pentamethylene (—(CH$_2$)$_5$—). In some embodiments of the copolymer, x is 1.

In a specific embodiment of the copolymer, the acid-labile difunctional monomer has the structure

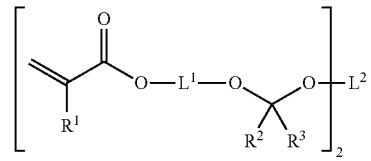

wherein each occurrence of $R^1$ is independently hydrogen, fluoro, methyl, trifluoromethyl, or cyano; each occurrence of $R^2$ and $R^3$ is independently hydrogen, unsubstituted or substituted $C_{1-18}$ linear or branched alkyl, unsubstituted or substituted $C_{3-18}$ cycloalkyl, unsubstituted or substituted $C_{6-18}$ aryl, or unsubstituted or substituted $C_{3-18}$ heteroaryl, or $R^2$ and $R^3$ are covalently linked to each other to form a ring that includes —$R^2$—C—$R^3$—; each occurrence of $L^1$ and $L^2$ is independently unsubstituted or substituted $C_{1-8}$-alkylene, unsubstituted or substituted —C(=O)—$C_{1-8}$-alkylene, unsubstituted or substituted —C(=O)—($C_{1-8}$-alkylene)-C(=O)—, unsubstituted or substituted —($C_{1-8}$-alkylene)-O—($C_{1-8}$-alkylene)-, unsubstituted or substituted —C(=O)—($C_{1-8}$-alkylene)-O—($C_{1-8}$-alkylene)-, or unsubstituted or substituted —C(=O)—($C_{1-8}$-alkylene)-O—($C_{1-8}$-alkylene)-C(=O)—.

Specific examples of difunctional monomers include

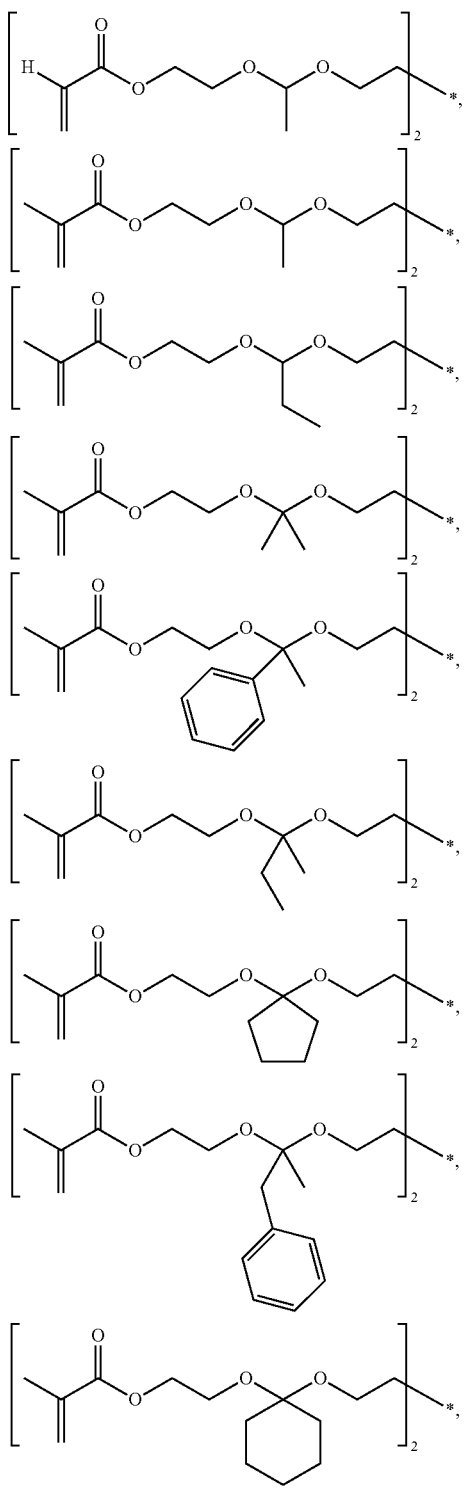

and combinations thereof.

The acid-labile difunctional monomer is copolymerized with a mono(meth)acrylate ester comprising a base-solubility-enhancing mono(meth)acrylate ester, an acid-labile mono(meth)acrylate ester, a photoacid-generating mono(meth)acrylate ester, or a combination thereof.

The base-solubility-enhancing mono(meth)acrylate esters include lactone-substituted mono(meth)acrylate esters, base-soluble mono(meth)acrylate esters, and combinations thereof. Illustrative examples of aliphatic, lactone-substituted mono(meth)acrylate esters include

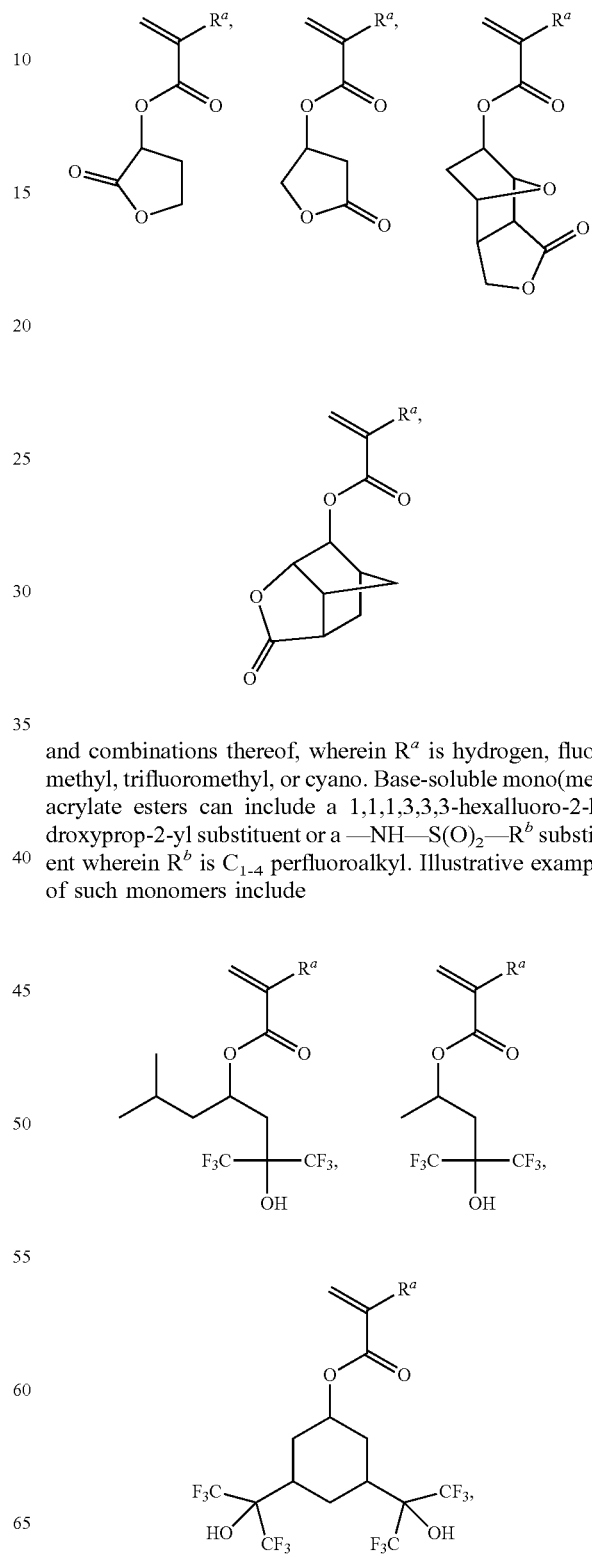

and combinations thereof, wherein $R^a$ is hydrogen, fluoro, methyl, trifluoromethyl, or cyano. Base-soluble mono(meth)acrylate esters can include a 1,1,1,3,3,3-hexafluoro-2-hydroxyprop-2-yl substituent or a —NH—S(O)$_2$—$R^b$ substituent wherein $R^b$ is $C_{1-4}$ perfluoroalkyl. Illustrative examples of such monomers include

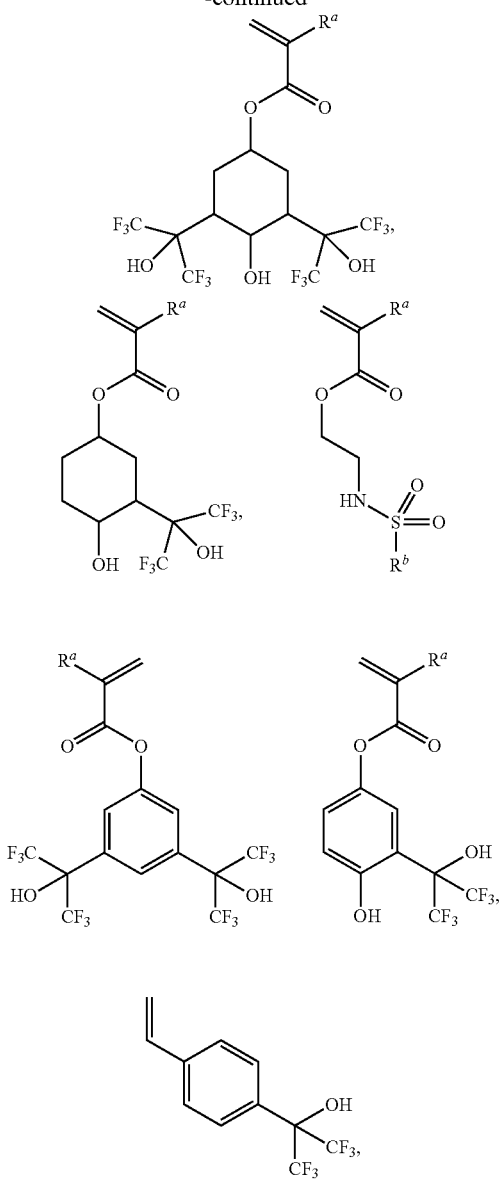

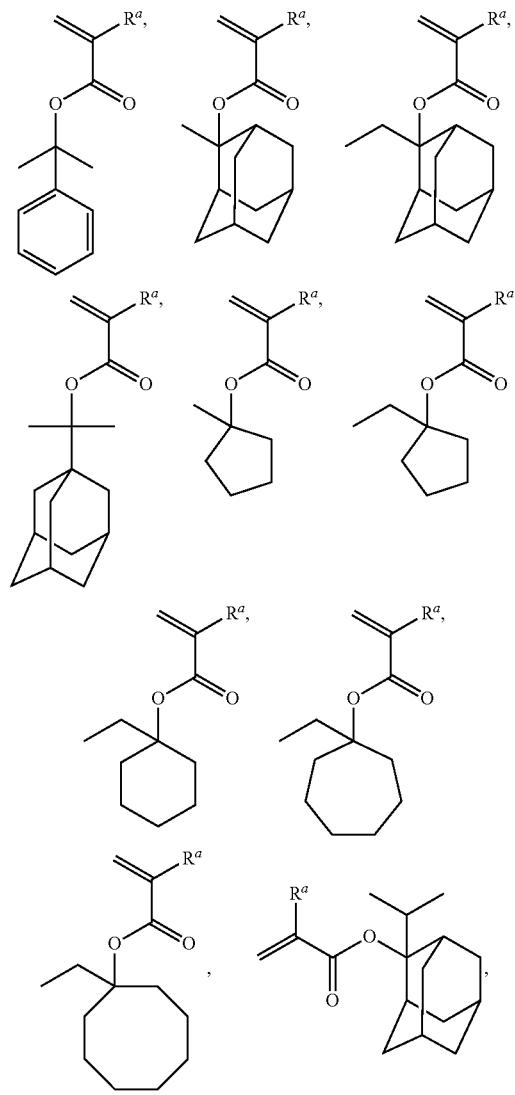

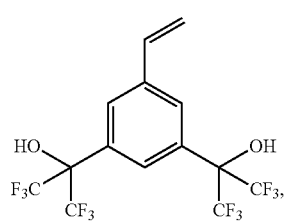

and combinations thereof, wherein $R^a$ is hydrogen, fluoro, methyl, trifluoromethyl, or cyano.

Illustrative acid-labile formal-, acetal-, and ketal-substituted monomers include

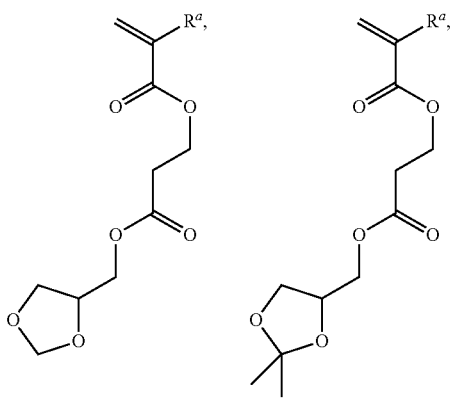

and combinations thereof, wherein $R^a$ is hydrogen, fluoro, methyl, trifluoromethyl, or cyano, and $R^b$ is $C_{1-4}$ perfluoroalkyl.

The acid-labile mono(meth)acrylate ester can derive its acid lability from a carboxylic acid ester group, a formal group, an acetal group, a ketal group, or a combination thereof. Illustrative acid-labile mono(meth)acrylate esters include the following unsubstituted and substituted tertiary (meth)acrylate esters

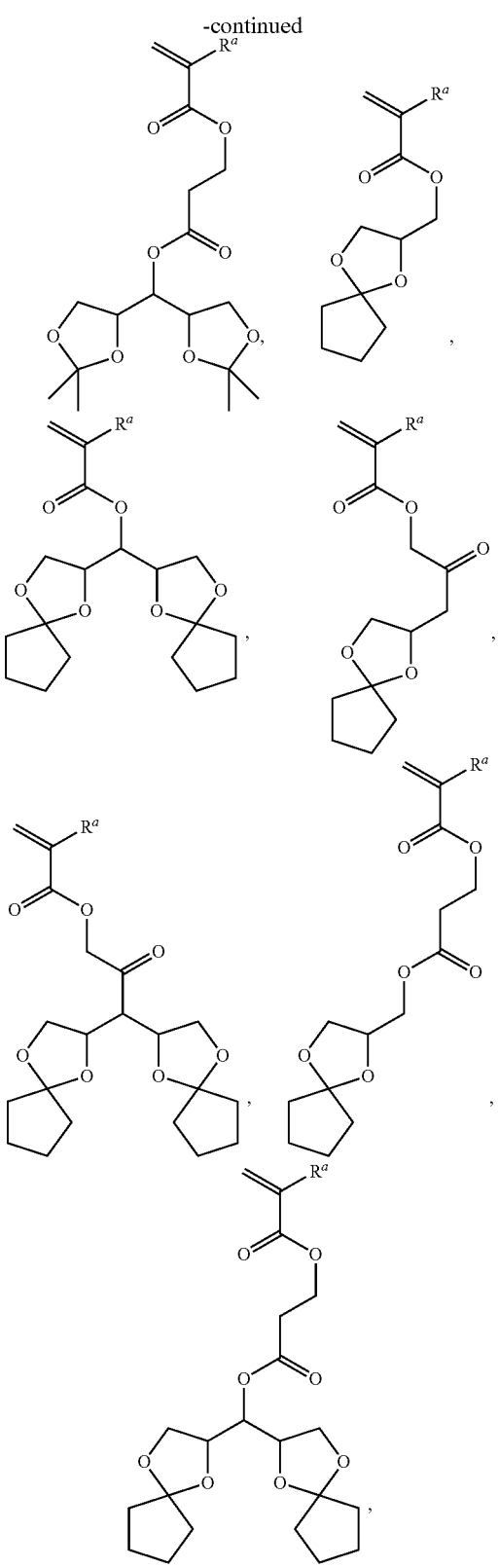

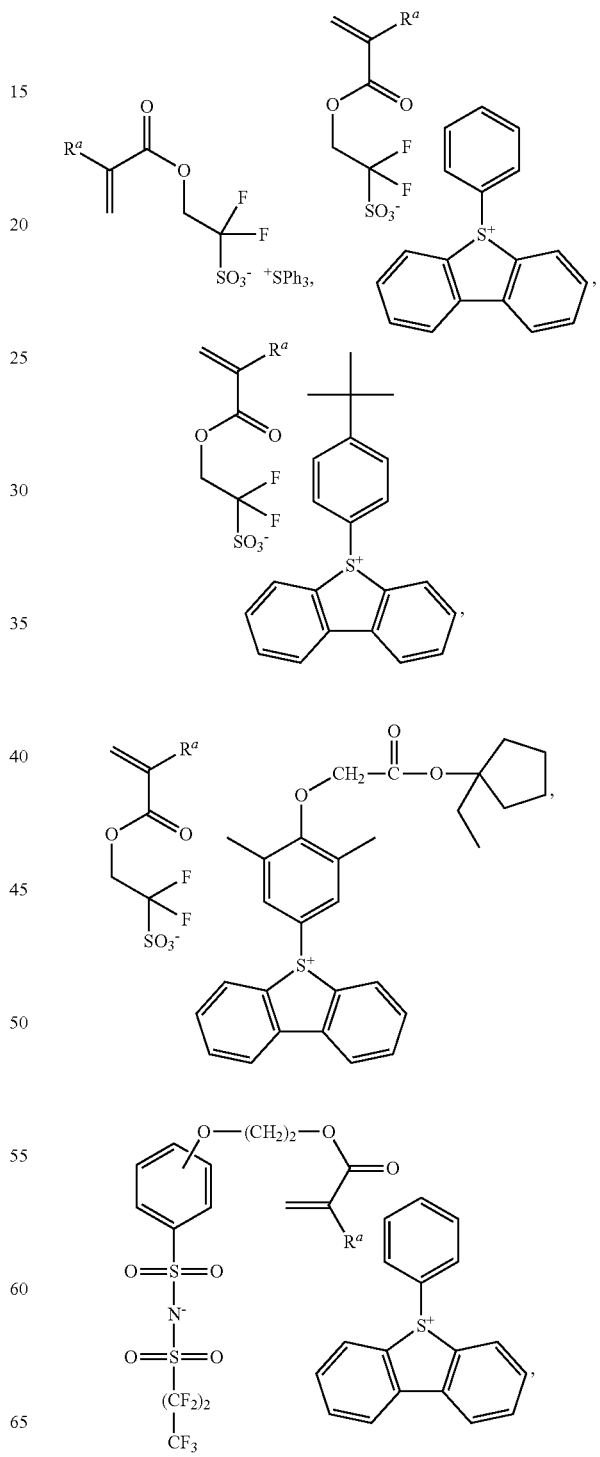

and combinations thereof, wherein $R^a$ is hydrogen, fluoro, methyl, trifluoromethyl, or cyano.

The photoacid-generating mono(meth)acrylate esters comprise an anion and a photosensitive cation, either of which can include the mono(meth)acrylate ester. In other words, the residue of the photoacid-generating mono(meth)acrylate ester can be covalently bound to the copolymer via the anion or the cation. The anion can comprise a sulfonate group, a sulfonamidate group (i.e., anion of sulfonamide), or a sulfonimidate group (i.e., anion of sulfonimide). The photosensitive cation can comprise a sulfonium or iodonium cation. Any photoacid-generating monomer useful for forming an EUV photoresist copolymer can be used. Illustrative examples of such monomers include -continued

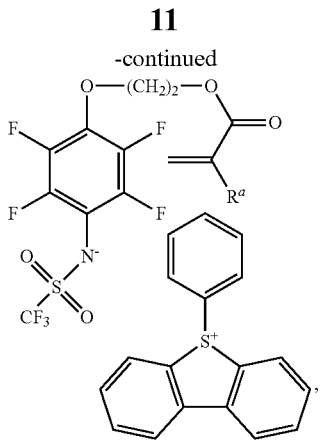

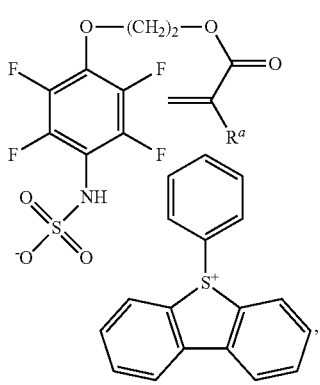

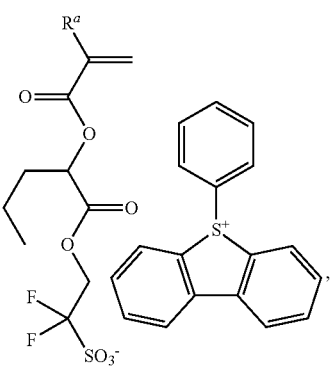

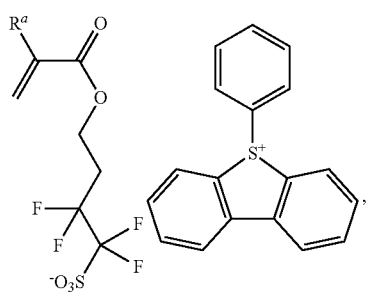

-continued

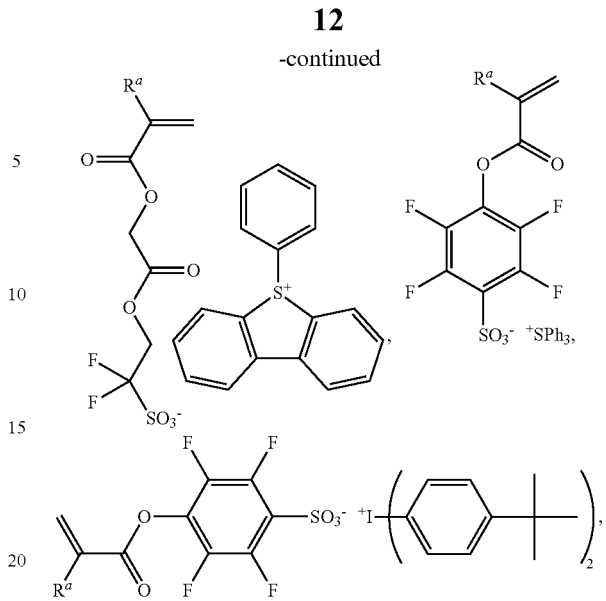

and combinations thereof, wherein $R^a$ is hydrogen, fluoro, methyl, trifluoromethyl, or cyano.

The mono(meth)acrylate ester can, optionally, further include additional types of esters such as, for example, methyl (meth)acrylate, ethyl (meth)acrylate, and butyl (meth)acrylate.

In some embodiments, the monomers comprise, based on 100 mole percent total monomers, 5 to 30 mole percent, specifically 5 to 20 mole percent, of the acid-labile difunctional monomer, and 70 to 95 mole percent, specifically 80 to 95 mole percent, of the mono(meth)acrylate ester.

In some embodiments, the monomers further comprise a styrenic monomer comprising styrene, a substituted styrene, or a combination thereof. In these embodiments, the content of the styrenic monomer can be 1 to 25 mole percent, specifically 1 to 15 mole percent, based on 100 mole percent total monomers. In other embodiments, styrenic equivalents can be partially or fully substituted for the mono(meth)acrylate ester. In these embodiments, the content of styrenic monomer can be 10 to 95 mole percent, specifically 25 to 95 mole percent, more specifically 50 to 95 mole percent, based on 100 mole percent total monomers.

In some embodiments, the monomers comprising the acid-labile difunctional monomer and the mono(meth)acrylate ester are copolymerized by living free radical polymerization. In some embodiments, the monomers comprising the acid-labile difunctional monomer and the mono(meth)acrylate ester are copolymerized using reversible addition fragmentation chain transfer (RAFT) polymerization. When the copolymer is prepared by RAFT polymerization, it is preferred to remove the RAFT agent-derived end group from the copolymer before utilizing the copolymer in a photoresist composition. The monomers can also be copolymerized using other controlled radical polymerizations, including atom transfer radical polymerization, and nitroxide-mediated polymerization.

In some embodiments, the copolymer has a weight average molecular weight of 10,000 to 1,000,000 grams/mole, specifically 20,000 to 600,000 grams/mole.

Another embodiment is a copolymer comprising repeat units derived from an acid-labile difunctional monomer and repeat units derived from a mono(meth)acrylate ester, wherein the acid-labile difunctional monomer has the structure

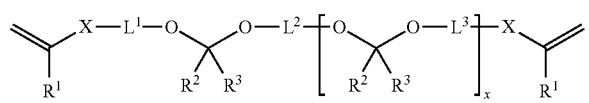

wherein each occurrence of $R^1$ is independently hydrogen, fluoro, methyl, trifluoromethyl, or cyano; each occurrence of $R^2$ and $R^3$ is independently hydrogen, unsubstituted or substituted $C_{1-18}$ linear or branched alkyl, unsubstituted or substituted $C_{3-18}$ cycloalkyl, unsubstituted or substituted $C_{6-18}$ aryl, or unsubstituted or substituted $C_{3-18}$ heteroaryl, or $R^2$ and $R^3$ are covalently linked to each other to form a ring that includes —$R^2$—C—$R^3$—; each occurrence of $L^1$, $L^2$, and $L^3$ is independently unsubstituted or substituted $C_{1-8}$-alkylene, unsubstituted or substituted —C(=O)—$C_{1-8}$-alkylene, unsubstituted or substituted —C(=O)—($C_{1-8}$-alkylene)-C(=O)—, unsubstituted or substituted —($C_{1-8}$-alkylene)-O—($C_{1-8}$-alkylene)-, unsubstituted or substituted —C(=O)—($C_{1-8}$-alkylene)-O—($C_{1-8}$-alkylene)-, or unsubstituted or substituted —C(=O)—($C_{1-8}$-alkylene)-O—($C_{1-8}$-alkylene)-C(=O)—; each occurrence of X is independently 1,2-phenylene, 1,3-phenylene, 1,4-phenylene, or —C(=O)—O— wherein the carbonyl carbon is bound to the adjacent carbon atom that is itself bound to $R^1$; and x is zero, 1, 2, or 3; and wherein the mono(meth)acrylate ester is selected from the group consisting of base-solubility-enhancing mono(meth)acrylate monomers, acid-labile mono(meth)acrylate monomers, photoacid-generating mono(meth)acrylate monomers, and combinations thereof.

In a very specific embodiment of the copolymer, the monomers comprise, based on 100 mole percent total monomers, 5 to 30 mole percent, specifically 5 to 20 mole percent, of the acid-labile difunctional monomer, 20 to 88 mole percent, specifically 30 to 83 mole percent, of the base-solubility-enhancing mono(meth)acrylate monomer, 5 to 50 mole percent, specifically 10 to 50 mole percent, of the acid-labile mono(meth)acrylate monomer, and 2 to 20 mole percent, specifically 2 to 10 mole percent, of the photoacid-generating mono(meth)acrylate monomer.

Another embodiment is a photoresist composition comprising the acid-labile hyperbranched copolymer in any of its above-described variations. In some embodiments, the acid-labile hyperbranched copolymer is the only copolymer in the photoresist composition. In other embodiments, the photoresist composition comprises the acid-labile hyperbranched copolymer and a linear copolymer. The linear copolymer can be the product of polymerizing two or more of the base-solubility-enhancing mono(meth)acrylate monomer, the acid-labile mono(meth)acrylate monomer, and the photo acid-generating mono(meth)acrylate monomer.

The photoresist composition can further include one or more photoactive components such as photoacid generators, photobase generators, photoinitiators, additional (meth)acrylate-based polymers with or without bound photoacid generators, polyhydroxystyrene-based polymers with or without bound photoacid generators, and combinations thereof.

Photoacid generators generally include those photoacid generators suitable for the purpose of preparing photoresists. Photoacid generators include, for example, non-ionic oximes and various onium ion salts. Onium ions include, for example, unsubstituted and substituted ammonium ions, unsubstituted and substituted phosphonium ions, unsubstituted and substituted arsonium ions, unsubstituted and substituted stibonium ions, unsubstituted and substituted bismuthonium ions, unsubstituted and substituted oxonium ions, unsubstituted and substituted sulfonium ions, unsubstituted and substituted selenonium ions, unsubstituted and substituted telluronium ions, unsubstituted and substituted fluoronium ions, unsubstituted and substituted chloronium ions, unsubstituted and substituted bromonium ions, unsubstituted and substituted iodonium ions, unsubstituted and substituted aminodiazonium ions (substituted hydrogen azide), unsubstituted and substituted hydrocyanonium ions (substituted hydrogen cyanide), unsubstituted and substituted diazenium ions ($RN=N^+R_2$), unsubstituted and substituted iminium ions ($R_2C=N^+R_2$), quaternary ammonium ions having two double-bonded substituents ($R=N^+=R$), nitronium ion ($NO_2^+$) bis(triarylphosphine)iminium ions (($Ar_3P)_2N^+$), unsubstituted or substituted tertiary ammonium having one triple-bonded substituent ($R\equiv NH^+$), unsubstituted and substituted nitrilium ions ($RC\equiv R^+$), unsubstituted and substituted diazonium ions ($N\equiv N^+R$), tertiary ammonium ions having two partially double-bonded substituents ($R=N^+H=R$), unsubstituted and substituted pyridinium ions, quaternary ammonium ions having one triple-bonded substituent and one single-bonded substituent ($R\equiv N^+R$), tertiary oxonium ions having one triple-bonded substituent ($R\equiv O^+$), nitrosonium ion ($N\equiv O^+$), tertiary oxonium ions having two partially double-bonded substituents ($R=O^+=R$), pyrylium ion ($C_5H_5O^+$), tertiary sulfonium ions having one triple-bonded substituent ($R\equiv S^+$), tertiary sulfonium ions having two partially double-bonded substituents ($R=S^+=R$), and thionitrosonium ion ($N\equiv S^+$). In some embodiments, the onium ion is selected from unsubstituted and substituted diaryiodonium ions, and unsubstituted and substituted triarylsulfonium ions. Examples of suitable onium salts can be found in U.S. Pat. No. 4,442,197 to Crivello et al., U.S. Pat. No. 4,603,101 to Crivello, and U.S. Pat. No. 4,624,912 to Zweifel et al.

Suitable photoacid generators are known in the art of chemically amplified photoresists and include, for example: onium salts, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate; nitrobenzyl derivatives, for example, 2-nitrobenzyl-p-toluenesulfonate, 2,6-dinitrobenzyl-p-toluenesulfonate, and 2,4-dinitrobenzyl-p-toluenesulfonate; sulfonic acid esters, for example, 1,2,3-tris(methanesulfonyloxy)benzene, 1,2,3-tris(trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenesulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine. Suitable photoacid generators with specific examples are further described in U.S. Pat. No. 8,431,325 to Hashimoto et al. in column 37, lines 11-47 and columns 41-91. In some embodiments, the photoacid generator is non-polymeric.

The photoresist composition can include a photoinitiator. Photoinitiators are used in the photoresist composition for initiating polymerization of the cross-linking agents by generation of free-radicals. Suitable free radical photoinitiators include, for example, azo compounds, sulfur containing compounds, metallic salts and complexes, oximes, amines, polynuclear compounds, organic carbonyl compounds and mixtures thereof as described in U.S. Pat. No. 4,343,885, column 13, line 26 to column 17, line 18; and 9,10-anthraquinone; 1-chloroanthraquinone; 2-chloroanthraquinone; 2-methylanthraquinone; 2-ethylanthraquinone; 2-tert-butylanthraquinone; octamethylanthraquinone; 1,4-naphthoquinone; 9,10-phenanthrenequinone; 1,2-benzanthraquinone; 2,3-benzanthraquinone; 2-methyl-1,4-naphthoquinone; 2,3-dichloronaphthoquinone; 1,4-dimethylanthraquinone; 2,3-dimethylanthraquinone; 2-phenylanthraquinone; 2,3-diphenylanthraquinone; 3-chloro-2-methylanthraquinone; retenequinone; 7,8,9,10-tetrahydronaphthalenequinone; and 1,2,3,4-tetrahydrobenz(a)anthracene-7,12-dione. Other photoinitiators are described in U.S. Pat. No. 2,760,863 and include vicinal ketaldonyl alcohols, such as benzoin, pivaloin, acyloin ethers, e.g., benzoin methyl and ethyl ethers; and alpha-hydrocarbon-substituted aromatic acyloins, including alpha-methylbenzoin, alpha-allylbenzoin, and alpha-phenylbenzoin. Photoreducible dyes and reducing agents disclosed in U.S. Pat. Nos. 2,850,445; 2,875,047; and 3,097,096 as well as dyes of the phenazine, oxazine, and quinone classes; benzophenone, 2,4,5-triphenylimidazolyl dimers with hydrogen donors, and mixtures thereof as described in U.S. Pat. Nos. 3,427,161; 3,479,185; and 3,549,367 can be also used as photoinitiators.

The photoresist composition can further include a surfactant. Illustrative surfactants include fluorinated and non-fluorinated surfactants, and are preferably non-ionic. Exemplary fluorinated non-ionic surfactants include perfluoro $C_4$ surfactants such as FC-4430 and FC-4432 surfactants, available from 3M Corporation; and fluorodiols such as POLYFOX™ PF-636, PF-6320, PF-656, and PF-6520 fluorosurfactants from Omnova.

The photoresist composition can further include quenchers that are non-photo-destroyable bases. These include, for example, those based on hydroxides, carboxylates, amines, imines and amides. Such quenchers include $C_{1-30}$ organic amines, imines or amides, $C_{1-30}$ quaternary ammonium salts of strong bases (e.g., a hydroxide or alkoxide) or a weak base (e.g., a carboxylate). In some embodiments, the photoresist composition further comprises a quencher selected from the group consisting of $C_{1-30}$ amines, $C_{1-30}$ amides, and combinations thereof. Exemplary quenchers include amines such as Troger's base; hindered amines such as diazabicycloundecene (DBU), diazabicyclononene (DBN), and tetrahydroxy isopropyl diamine and tert-butyl-4-hydroxy-1-piperidiene carboxylate; ionic quenchers including quaternary alkyl ammonium salts such as tetrabutylammonium hydroxide (TBAH), tetramethylammonium 2-hydroxybenzoic acid (TMA OHBA), and tetrabutylammonium lactate. Suitable quenchers are further described in U.S. Pat. No. 8,431,325 to Hashimoto et al.

The photoresist components are typically dissolved in a solvent for dispensing and coating. Exemplary solvents include anisole; alcohols including 1-methoxy-2-propanol, and 1-ethoxy-2 propanol; esters including n-butyl acetate, ethyl lactate, 1-methoxy-2-propyl acetate, methoxyethoxy propionate, and ethoxyethoxy propionate; ketones including cyclohexanone and 2-heptanone; and combinations thereof. The solvent amount can be, for example, 70 to 99 weight percent, specifically 85 to 98 weight percent, based on the total weight of the photoresist composition.

The invention further includes a method of forming an electronic device, comprising: (a) applying a layer of any of the photoresist compositions described herein on a substrate; (b) pattern-wise exposing the photoresist composition layer to activating (e.g., extreme ultraviolet or electron beam) radiation; (c) developing the exposed photoresist composition layer to provide a resist relief image. The method can, optionally, further include (d) etching the resist relief pattern into the underlying substrate.

The substrate can be of a material such as a semiconductor, such as silicon or a compound semiconductor (e.g., III-V or II-VI), glass, quartz, ceramic, copper and the like. Typically, the substrate is a semiconductor wafer, such as single crystal silicon or compound semiconductor wafer, having one or more layers and patterned features formed on a surface thereof. Optionally, the underlying base substrate material itself may be patterned, for example, when it is desired to form trenches in the base substrate material. Layers formed over the base substrate material may include, for example, one or more conductive layers such as layers of aluminum, copper, molybdenum, tantalum, titanium, tungsten, and alloys, nitrides or silicides of such metals, doped amorphous silicon or doped polysilicon, one or more dielectric layers such as layers of silicon oxide, silicon nitride, silicon oxynitride or metal oxides, semiconductor layers, such as single-crystal silicon, underlayers, antireflective layers such as a bottom antireflective layers, and combinations thereof. The layers can be formed by various techniques, for example, chemical vapor deposition (CVD) such as plasma-enhanced CVD, low-pressure CVD or epitaxial growth, physical vapor deposition (PVD) such as sputtering or evaporation, electroplating or spin-coating.

Applying the photoresist composition to the substrate can be accomplished by any suitable method, including spin coating, spray coating, dip coating, and doctor blading. In some embodiments, applying the layer of photoresist composition is accomplished by spin coating the photoresist in solvent using a coating track, in which the photoresist composition is dispensed on a spinning wafer. During dispensing, the wafer can be spun at a speed of up to 4,000 rotations per minute (rpm), specifically 500 to 3,000 rpm, and more specifically 1,000 to 2,500 rpm. The coated wafer is spun to remove solvent, and baked on a hot plate to remove residual solvent and free volume from the film to make it uniformly dense.

Pattern-wise exposure is then carried out using an exposure tool such as a stepper, in which the film is irradiated through a pattern mask and thereby is exposed pattern-wise. In some embodiments, the method uses advanced exposure tools generating activating radiation at wavelengths capable of high resolution including extreme-ultraviolet (EUV) or electron-beam (e-beam) radiation. It will be appreciated that exposure using the activating radiation decomposes the PAG in the exposed areas and generates acid and decomposition by-products, and that the acid then effects a chemical change in the polymer (deblocking the acid sensitive groups to generate a base-soluble group) during the post exposure bake (PEB) step. The resolution of such exposure tools can be less than 30 nanometers.

Developing the exposed photoresist layer is then accomplished by treating the exposed layer with a suitable developer capable of selectively removing the exposed portions of the film (where the photoresist is positive tone) or removing the unexposed portions of the film (where the photoresist is crosslinkable in the exposed regions, i.e., negative tone). In some embodiments, the photoresist is positive tone based on a polymer having acid-sensitive (deprotectable) groups, and the developer is preferably a metal-ion-free tetraalkylammonium hydroxide solution, such as, for example, aqueous 0.26 Normal tetramethylammonium hydroxide. Alternatively, negative tone development (NTD) can be conducted by use of a suitable organic solvent developer. NTD results in the removal of unexposed regions of the photoresist layer, leaving behind exposed regions due to polarity reversal of those regions. Suitable NTD developers include, for example, ketones, esters, ethers, hydrocarbons, and mixtures thereof. Other suitable solvents include those used in the photoresist composition. In some embodiments, the developer is 2-heptanone or a butyl acetate such as n-butyl acetate. Whether the development is positive tone or negative tone, a pattern forms by developing.

The photoresist composition can, when used in one or more such a pattern-forming processes, be used to fabricate electronic and optoelectronic devices such as memory devices, processor chips (including central processing units or CPUs), graphics chips, and other such devices.

WORKING EXAMPLES

Monomers, reagents, and solvents used in the working examples are summarized in Table 1.

TABLE 1

| Abbreviation | Structure and Name |
| --- | --- |
| PPMA | 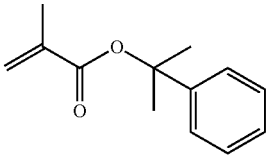<br>2-Phenyl-2-propyl methacrylate |
| di-HFA | 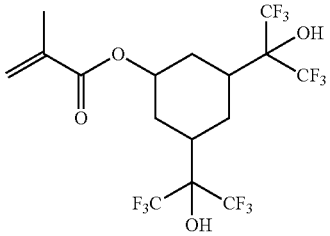 [SMILES: C=C(C)C(=O)OC1CC(C(O)(C(F)(F)F)C(F)(F)F)CC(C(O)(C(F)(F)F)C(F)(F)F)C1]<br>3,5-Bis(1,1,1,3,3,3-hexafluoro-2-hydroxy-prop-2-yl)cyclohexyl methacrylate |
| α-GBLMA | 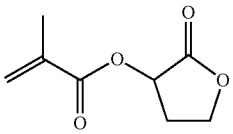<br>alpha-Methacryloyloxy-gamma-butyrolactone |
| PDBT-F2 PAG | 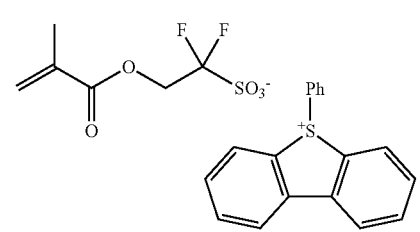<br>Phenyldibenzothiophenium 2,2,-difluoro-2-sulfonatoethyl methacrylate |
| di-AMA | 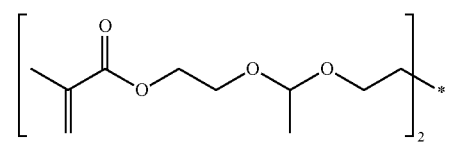<br>4,11-dimethyl-3,5,10,12-tetraoxatetradecane-1,14-diyl bis(2-methylacrylate) |

TABLE 1-continued

| Abbreviation | Structure and Name |
|---|---|
| RAFT agent | 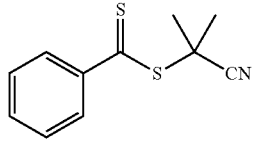<br>2-Cyanoprop-2-yl dithiobenzoate |
| V601 | 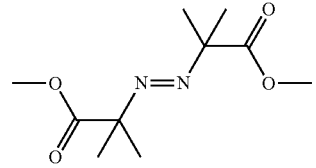<br>Dimethyl 2,2'-azobis(2-methylpropionate) |

Example 1

This example illustrates the synthesis of an acid-labile hyperbranched copolymer according to the present method.

A synthetic scheme is presented in FIG. 1. PPMA (1.00 gram, 4.90 millimoles), di-HFA (0.727 gram, 1.45 millimoles), alpha-GBLMA (1.06 gram, 6.22 millimoles), and PDBT-F2 PAG (0.324 gram, 0.661 millimole) were weighed into a 20 milliliter vial in a nitrogen-purged glovebox. Into a separate vial was weighed 4.7 grams of a 70:30 mixture of gamma-butyrolactone and ethyl lactate (enough solvent to produce a 40% solids mixture). Half of this solvent was added to the monomers to dissolve them fully. The RAFT agent 2-cyanoprop-2-yl dithiobenzoate (0.433 gram, 1.96 millimoles) was weighed into a 20 milliliter vial and the monomer solution was filtered through neutral alumina (~2 centimeter plug) directly into the vial with the RAFT agent. This was followed by passing the remaining solvent through the alumina column and into the vial. V601 initiator (112 milligrams, 0.48 millimole, 0.25 equivalent based on RAFT agent) was weighed into a separate vial and then added to the monomer/RAFT agent solution. Finally 788 milligrams (1.96 millimoles, 1.0 equivalent based on RAFT agent) of the dimethacrylate (di-AMA) was added to the vial. A stir bar was added and the vial was capped and heated at 60° C. overnight.

After 16 hours the contents were looking quite viscous. The vial was removed from the heat and an aliquot was analyzed by $^1$H and $^{19}$F NMR. Based on PAG monomer the conversion was ~70%. It was removed from the glovebox, precipitated into 100 milliliters of 95:5 diisopropyl ether/methanol, and filtered. The gooey polymer was redissolved in THF and then precipitated again into pure diethyl ether, forming a pink powder. This was filtered and dried at room temperature in the vacuum oven overnight. Polymer yield: 2.3 grams (65%).

The dried polymer (2.30 grams) and V601 (3.65 grams, 15.9 millimoles, 20 equivalents based on RAFT agent) were both weighed into a 100 milliliter roundbottom flask and dissolved in 12 milliliters dry $CH_3CN$ in the glovebox. The flask was equipped with a condenser and heated to 80° C. in a preheated reaction block for 2.5 hour.

The flask was removed from the glovebox, cooled to room temperature, and the contents precipitated into pure diethyl ether. This formed a milky pink solution with a gooey solid. The solution was decanted and the solid was stirred vigorously with additional diethyl ether to form an off-white powder. This was left to air dry overnight and then dried in the vacuum oven at room temperature overnight.

Molecular weight characteristics were determined with gel permeation chromatography (GPC) using polystyrene standards. The copolymer after RAFT end group removal had a weight average molecular weight of 234,800 grams/mole and a dispersity of 10.19.

The acid-cleavable nature of the copolymer was demonstrated as follows. A small portion of the polymers were dissolved in THF and a few drops of concentrated HCl were added to the solution, followed by the addition of a few drops of triethylamine (added to quench the remaining acid). The mixtures were filtered and analyzed by GPC as described above.

Figure 2:
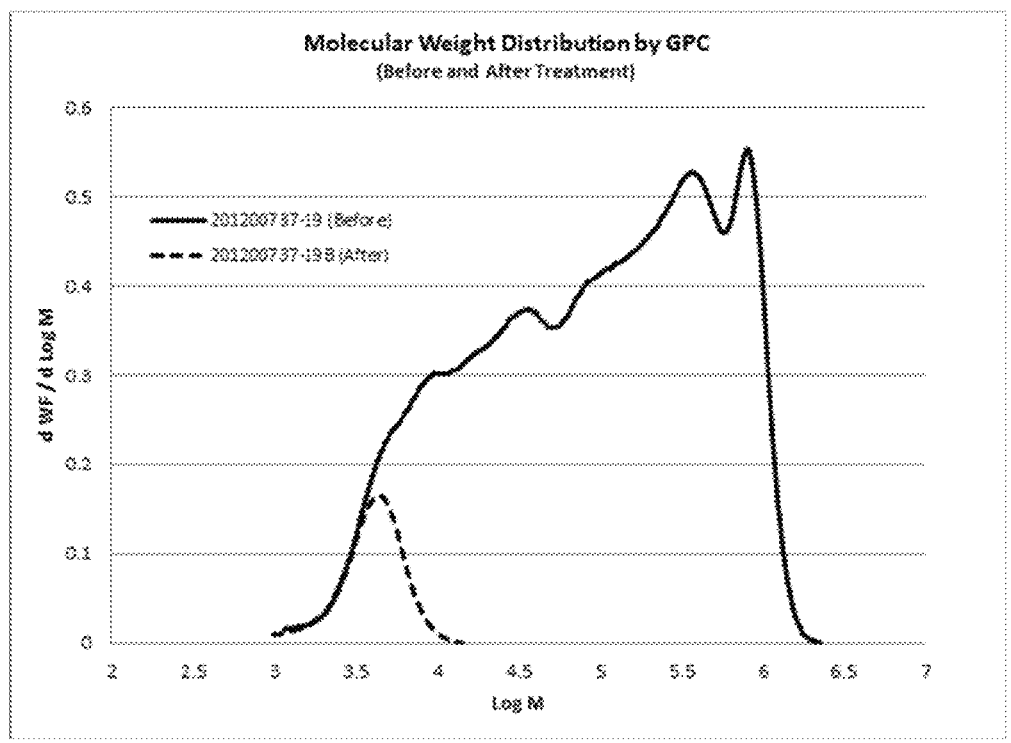
FIG. 2 presents chromatograms for an acid-labile hyperbranched copolymer before (solid line) and after (dashed line) acid treatment.

FIG. 2 includes chromatograms for the copolymer before and after acid treatment. Analysis of the molecular weight distributions indicates that acid treatment reduces the weight average molecular weight from 234,800 to 4,400 grams/mole, and the dispersity from 10.19 to 1.21.

Examples 2 and 3

The general procedure of Example 1 was used to prepare two additional copolymers. Variations in reaction conditions and product molecular weight characteristics are summarized in Table 2. For each numbered example, the "a" variant is the copolymer as synthesized by RAFT. The "b" variant is the copolymer after RAFT end group removal. And the "c" variant is the product of acid treatment of the copolymer after RAFT end group removal. (The large excess of radical initiator (V601) used in the end group removal process caused any "half reacted" crosslinking monomer to fully react, increasing the polymer's weight average molecular weight and dispersity.) The weight average molecular weight (Mw) of the hyperbranched polymer can be controlled by the di-AMA:RAFT agent ratio, as demonstrated by the Mw range of 149,000 to 9,900 grams/mole. Despite this very large range of Mw values, the polymer fragments following acid cleavage maintain a consistent and low Mw, and this is controlled by the molar ratio of RAFT agent to monomer. Therefore, a hyperbranched polymer with Mw=235,000 and one with Mw=18,000 both degrade to the same Mw fragments under acidic conditions. Also, because RAFT is used as the polymerization method, the fragments have low PDIs which should lead to uniform solubility in alkaline developer.

TABLE 2

| Example | RAFT:PPMA | di-AMA:RAFT | Time (h) | Mw (grams/mole) | Dispersity |
|---|---|---|---|---|---|
| 1a | 0.4 | 1.0 | 16 | 77,200 | 7.74 |
| 1b | 1a after end group removal | | | 234,800 | 10.19 |
| 1c | 1b after acid treatment | | | 4,400 | 1.21 |
| 2a | 0.2 | 1.5 | 18 | 149,000 | 10.4 |
| 2b | 2a after end group removal | | | 542,000 | 21.3 |
| 2c | 2b after acid treatment | | | 8,600 | 1.33 |
| 3a | 0.4 | 0.5 | 16 | 9,900 | 1.84 |
| 3b | 2a after end group removal | | | 18,500 | 2.11 |
| 3c | 2b after acid treatment | | | 4,400 | 1.21 |

Lithography

Table 3 presents data collected from contrast curve measurements obtained for photoresist compositions containing each of the three hyperbranched polymer samples.

Developer Strip Measurements. Developer strip was obtained by coating a photoresist on a silicon wafer, baking at 110° C. for 90 seconds, measuring the thickness of the film, contacting the film with 0.26 Normal aqueous tetramethylammonium hydroxide solution for 60 seconds, and re-measuring thickness of the film.

Contrast Curve Measurements. Contrast curve measurements utilizing a 248 nanometer light source were obtained using a Canon ES2 scanner with 0.8 numeric aperture. Contrast curve measurements utilizing a 13.5 nanometer light source were obtained using a Litho Tech Japan EUVES-9000 flood exposure tool. Photoresist Examples 1-3 were formulated by mixing 9.975 grams of a 10 weight percent polymer solution in methyl 2-hydroxyisobutyrate, 0.299 grams of 0.5 weight percent N,N,N',N'-tetrakis(2-hydroxypropyl)ethylenediamine quencher base solution in ethyl lactate, and 0.2 grams of 0.5 weight percent Omnova PolyFox™PF-656 surfactant solution in ethyl lactate with 26.804 grams ethyl lactate and 2.722 grams methyl 2-hydroxyisobutyrate and filtering through a 0.2 micrometer polytetrafluoroethylene syringe filter. The resist was spin coated onto 60 nanometer organic Bottom Anti-Reflective Coating (AR9) on a 200 millimeter diameter silicon wafer and baked at 110° C. for 90 seconds, to form a 50 nanometer thick photoresist film. The resist was exposed to an increasing dose of 248 nanometer radiation (range 2-50 millijoules/centimeter$^2$, 0.5 millijoule/centimeter$^2$ increment) or 13.5 nanometer EUV radiation (range 0-6 millijoules/centimeter$^2$, 0.25-0.30 millijoule/centimeter$^2$ increment), post exposure baked (PEB) at 100° C. for 60 seconds and developed with 0.26 N aqueous tetramethylammonium hydroxide solution to form a pattern. Thickness was measured at each exposed area and plotted versus dose.

The evaluation results are summarized in Table 3, where "Fragment Mw" is the weight average molecular weight of the polymer after acid treatment as described in the context of Examples 2 and 3. Importantly, developer strip is low on each sample. The E0 values at 248 nanometers exposure show an interesting trend. Example 2b copolymer with very high molecular weight shows a slightly elevated E0 compared to values associated with lower molecular weight Example 1b and 3b copolymers. The E0 values for photoresists with the Example 1b and 3b copolymer are essentially the same, despite the fact that the copolymers have very different (low vs. high) molecular weights. In the case of non-degradable polymers, one would expect a polymer with ten times higher Mw to be slower (i.e., have a higher E0 value), but in this case the photospeeds are nearly identical.

TABLE 3

| Polymer | Mw (grams/mole) | Fragment Mw (grams/mole) | Dev. Strip (Å) | 248 nm E0 (mJ/cm$^2$) | EUV nm E0 (mJ/cm$^2$) |
|---|---|---|---|---|---|
| 2b | 542,000 | 8,600 | 11 | 34 | — |
| 1b | 234,000 | 4,400 | 16 | 27 | 2.7 |
| 3b | 18,500 | 4,400 | 13 | 26.5 | 3.3 |

Example 4

Comparative Example 1

EUV Formulation and Lithography. Scale-up of hyperbranched copolymer Example 3b using the same reaction conditions and monomer ratios yielded a copolymer with a Mw of 19,400 grams/mole and a fragment Mw of 5,000 grams/mole. This material was formulated in the same way as Examples 1-3 to give Example 4.

Comparative Example 1 was prepared using a blend of two linear polymers as prepared by free radical polymerization and having similar monomer ratios. Polymer 1:36% PPMA, 47% α-GBLMA, 10% di-HFA, and 7% PDBT-F2. Polymer 2:35% PPMA, 49% α-GBLMA, 9% di-HFA, and 7% PDBT-F2. For the blend of two linear polymers, the weight average molecular weight was 5700 grams/mole.

Comparative Example 1 was formulated by mixing 9.975 grams of a 10 weight percent polymer solution in ethyl lactate, 0.299 grams of 0.5 weight percent N,N,N',N'-tetrakis (2-hydroxypropyl)ethylenediamine quencher base solution in ethyl lactate, and 0.2 grams of 0.5 weight percent Omnova PolyFox™ PF-656 surfactant solution in ethyl lactate with 17.826 grams ethyl lactate and 11.700 grams methyl 2-hydroxyisobutyrate and filtering through a 0.01 micrometer ultra-high molecular weight polyethylene syringe filter. The photoresists were spin coated onto an organic underlayer coating on a 200 millimeter silicon wafer and baked at 110° C. for 90 seconds to form a 50 nanometer thick resist film. The resulting photoresists were exposed to 13.5 nanometer EUV radiation through a patterned mask to image 28 and 24 nanometer 1:1 line/space (L/S) features using the 0.30 numerical aperture SEMATECH (Albany) MET tool. The exposed wafers were post exposure baked at 100° C. for 60 seconds and developed with 0.26 Normal aqueous tetramethylammonium hydroxide developer solution to form a positive-tone photoresist pattern. Linewidth and linewidth roughness (LWR) were determined by top-down scanning electron microscopy (SEM) using a Hitachi 9380 CD-SEM, operating at an accelerating voltage of 800 volts (V), probe current of 8.0 picoamperes (pA), using 200,000 times magnification at 1.0 digital zoom, with the number of frames set to 64. LWR was measured over a 2 micrometer line length in steps of 40 nanometers, and reported as the average for the measured region.

Figure 3A:
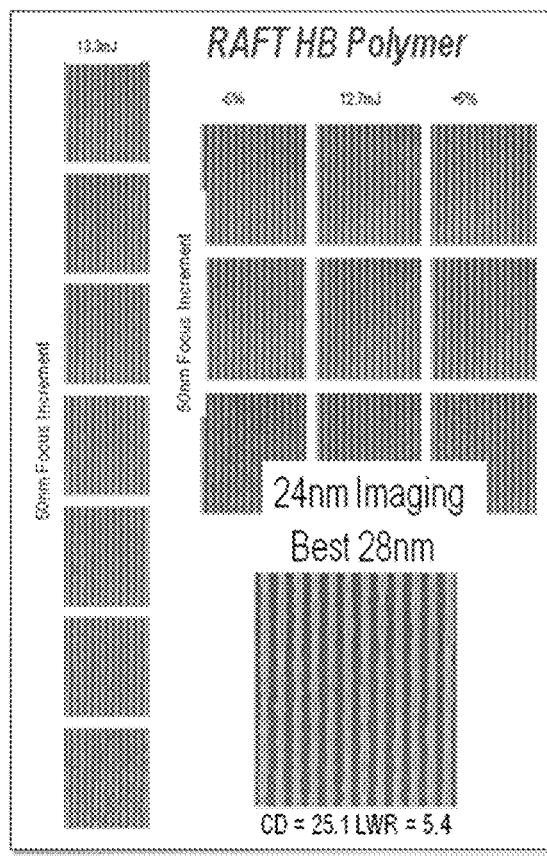
FIGS. 3A-3B show EUV lithography line patterns for photoresist compositions containing (3A) hyperbranched and (3B) linear copolymers.
Figure 3B:
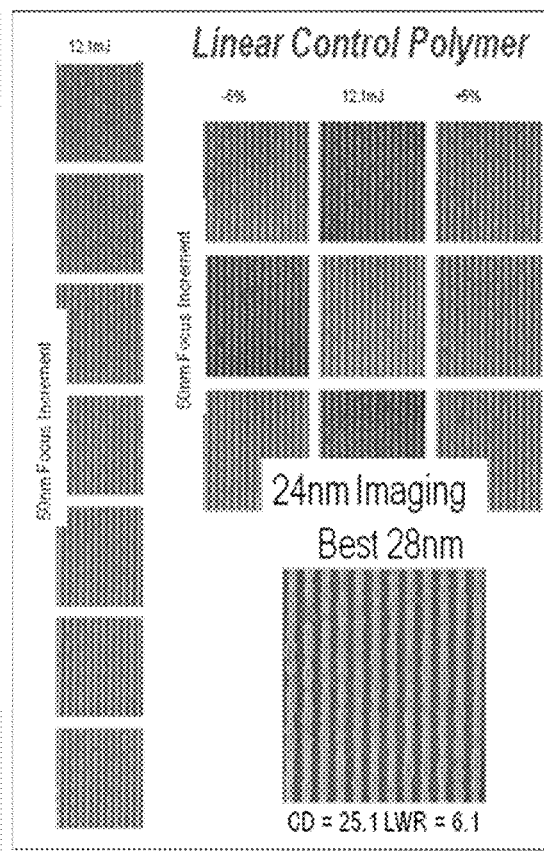

The evaluation results are summarized in Table 4 and FIGS. 3A-3B. Both resists had similar dose to size for both the 28 nm and 24 nm dense line features. The resist containing the hyperbranched polymer (Example 4; "RAFT HB Polymer" in FIG. 3A) had improved linewidth roughness (LWR) for the 28 nm dense line feature at best focus and best exposure compared to the resist containing the linear polymer (Comparative Example 1; "Linear Control Polymer" in FIG. 3B). Additionally, the hyperbranched resist had less top-line erosion (film loss in the unexposed area) through focus at the 28 nm dense line sizing energy and in the 24 nm focus-exposure matrix in general. The observed LWR result of the hyperbranched resist is consistent with the hypothesis regarding improved LWR with polymers that have backbone cleavability capable of producing low Mw fragments.

TABLE 4

| EUV L/S Lithography | Example 4 | Comp. Example 1 |
|---|---|---|
| 28 nm LS dose to size (mJ/cm$^2$) | 12.83 | 12.01 |
| 24 nm LS dose to size (mJ/cm$^2$) | 12.7 | 12.1 |
| 28 nm LWR (nm) | 5.4 | 6.1 |
| line erosion | better | worse |

The invention claimed is:

1. An acid-labile hyperbranched copolymer, comprising the product of copolymerizing monomers comprising
an acid-labile difunctional monomer having the structure

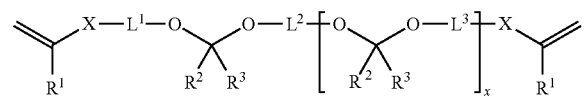

wherein each occurrence of $R^1$ is independently hydrogen, fluoro, methyl, trifluoromethyl, or cyano; each occurrence of $R^2$ and $R^3$ is independently hydrogen, unsubstituted or substituted $C_{1-18}$ linear or branched alkyl, unsubstituted or substituted $C_{3-18}$ cycloalkyl, unsubstituted or substituted $C_{6-18}$ aryl, or unsubstituted or substituted $C_{3-18}$ heteroaryl, and $R^2$ and $R^3$ are not covalently linked, or covalently linked to each other to form a ring that includes —$R^2$—C—$R^3$—; each occurrence of $L^1$, $L^2$, and $L^3$ is independently unsubstituted or substituted $C_{1-8}$-alkylene, unsubstituted or substituted —C(=O)—$C_{1-8}$-alkylene, unsubstituted or substituted —C(=O)—($C_{1-8}$-alkylene)-C(=O)—, unsubstituted or substituted —($C_{1-8}$-alkylene)-O—($C_{1-8}$-alkylene)-, unsubstituted or substituted —C(=O)—($C_{1-8}$-alkylene)-O—($C_{1-8}$-alkylene)-, or unsubstituted or substituted —C(=O)—($C_{1-8}$-alkylene)-O—($C_{1-8}$-alkylene)-C(=O)—; each occurrence of X is independently 1,2-phenylene, 1,3-phenylene, 1,4-phenylene, or —C(=O)—O— wherein the carbonyl carbon is bound to the adjacent carbon atom that is itself bound to $R^1$; and x is 1, 2, or 3; and
a mono(meth)acrylate ester comprising a base-solubility-enhancing mono(meth)acrylate ester, an acid-labile mono(meth)acrylate ester, a photoacid-generating mono(meth)acrylate ester, or a combination thereof
to form a copolymer having a weight average molecular weight of 10,000 to 1,000,000 grams/mole;
wherein the copolymerized monomers exclude styrene and substituted styrenes.

2. The copolymer of claim 1, wherein each occurrence of $L^1$, $L^2$, and $L^3$ is independently $C_{2-4}$-alkylene, and each occurrence of X is —C(=O)—O— wherein the carbonyl carbon is bound to the adjacent carbon atom that is itself bound to $R^1$.

3. The copolymer of claim 1, wherein each occurrence of $R^2$ and $R^3$ is independently hydrogen, methyl, or ethyl; or $R^2$ and $R^3$ are covalently linked to each other to form tetramethylene (—(CH$_2$)$_4$—) or pentamethylene (—(CH$_2$)$_5$—).

4. The copolymer of claim 1, wherein x is 1.

5. The copolymer of claim 1, wherein the acid-labile difunctional monomer has the structure

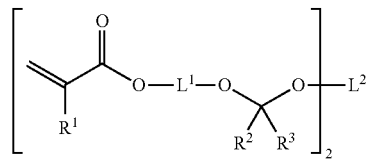

wherein $R^1$, $R^2$, $R^3$, and L are defined as in claim 1.

6. The copolymer of claim 1, wherein the monomers comprise
5 to 30 mole percent of the acid-labile difunctional monomer,
20 to 88 mole percent of the base-solubility-enhancing mono(meth)acrylate monomer,
5 to 50 mole percent of acid-labile mono(meth)acrylate monomer, and
2 to 20 mole percent of the photoacid-generating mono (meth)acrylate monomer.

7. An acid-labile hyperbranched copolymer, comprising the product of copolymerizing monomers comprising
an acid-labile difunctional monomers selected from the group consisting of

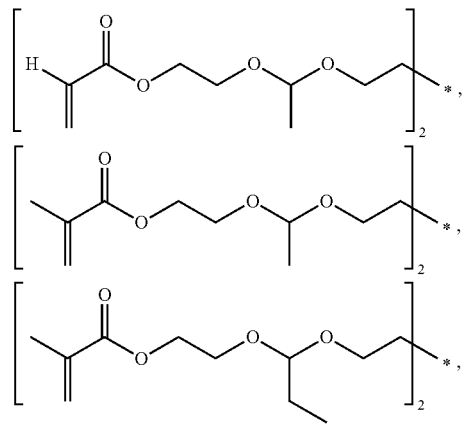

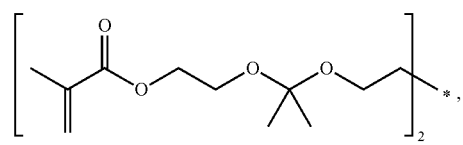

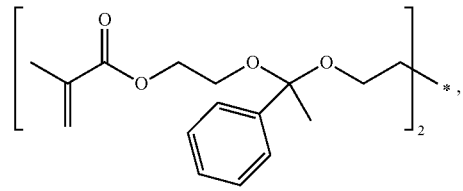

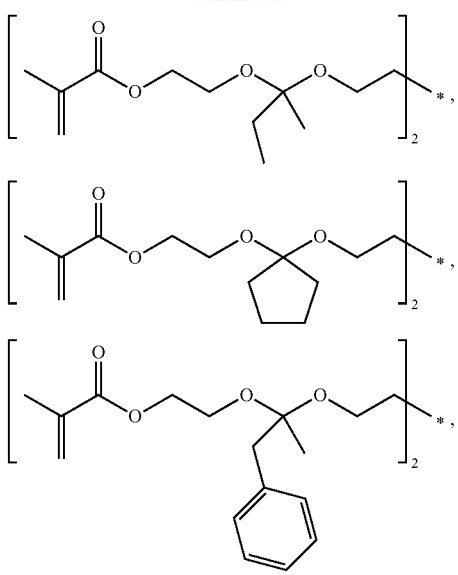

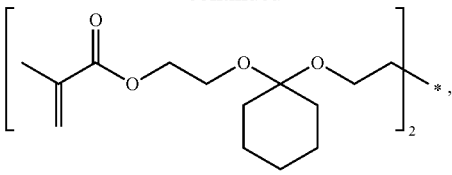

and combinations thereof; and a mono(meth)acrylate ester comprising a base-solubility-enhancing mono(meth)acrylate ester, an acid-labile mono(meth)acrylate ester, a photoacid-generating mono(meth)acrylate ester, or a combination thereof to form a copolymer.

8. A photoresist composition comprising the copolymer of claim 1.

9. A method of forming an electronic device, comprising:
(a) applying a layer of the photoresist composition of claim 8 on a substrate;
(b) pattern-wise exposing the photoresist composition to activating radiation; and
(c) developing the exposed photoresist composition layer to provide a resist relief image.

* * * * *